United States Patent
Kondo et al.

(10) Patent No.: US 8,918,194 B2
(45) Date of Patent: Dec. 23, 2014

(54) MOUNTING-LINE POWER CONTROL DEVICE AND MOUNTING-LINE POWER CONTROL METHOD

(75) Inventors: Hiroyuki Kondo, Kyoto (JP); Tomotaka Nishimoto, Osaka (JP); Masahiro Taniguchi, Yamanashi (JP); Masanori Ikeda, Yamanashi (JP); Kazuo Kido, Osaka (JP)

(73) Assignee: Panasonic Corporation, Osaka (JP)

( * ) Notice: Subject to any disclaimer, the term of this patent is extended or adjusted under 35 U.S.C. 154(b) by 508 days.

(21) Appl. No.: 13/382,164

(22) PCT Filed: Mar. 22, 2011

(86) PCT No.: PCT/JP2011/001669
§ 371 (c)(1),
(2), (4) Date: Jan. 4, 2012

(87) PCT Pub. No.: WO2011/121934
PCT Pub. Date: Oct. 6, 2011

(65) Prior Publication Data
US 2012/0102343 A1  Apr. 26, 2012

(30) Foreign Application Priority Data

Mar. 31, 2010 (JP) .................................. 2010-084203

(51) Int. Cl.
*G05B 11/01* (2006.01)
*H05K 13/08* (2006.01)

(52) U.S. Cl.
CPC ..................................... *H05K 13/08* (2013.01)
USPC ................... 700/22; 700/19; 700/33; 700/95; 700/117; 700/291

(58) Field of Classification Search
CPC . H05K 13/0452; H05K 3/0097; H05K 1/181; H05K 3/341; H05K 1/183; H05K 2203/163
USPC .................. 700/19, 33, 95, 117, 291, 297
See application file for complete search history.

(56) References Cited

U.S. PATENT DOCUMENTS

| | | | |
|---|---|---|---|
| 7,606,151 B2 | 10/2009 | Chilukoor | |
| 7,725,745 B2 | 5/2010 | Gabor et al. | |

(Continued)

FOREIGN PATENT DOCUMENTS

| | | |
|---|---|---|
| CN | 1728411 | 2/2006 |
| CN | 1926665 | 3/2007 |

(Continued)

OTHER PUBLICATIONS

Chinese Office Action (with English translation) issued Jun. 5, 2014 in the corresponding Chinese Patent Application No. 201180002801.6.

(Continued)

*Primary Examiner* — Mohammad Ali
*Assistant Examiner* — John Park
(74) *Attorney, Agent, or Firm* — Wenderoth, Lind & Ponack, L.L.P.

(57) ABSTRACT

A mounting-line power control device (100) includes: a target value obtaining unit (110) which obtains, for each mounting line, a target value for demand power for a first period; a priority obtaining unit (120) which obtains a first priority level of each mounting line; a target value changing unit (130) which decreases the target value for the demand power of a second mounting line in the first period when the demand power of a first mounting line in the first period exceeds its target value, the second mounting line having the lower first priority level than the first mounting line; and a power usage changing unit (140) which reduces power used in the first period by the component-mounted board production apparatus included in the second mounting line, such that the demand power of the second mounting line in the first period does not exceed the decreased target value.

9 Claims, 10 Drawing Sheets

(56) References Cited

U.S. PATENT DOCUMENTS

| | | | |
|---|---|---|---|
| 7,962,770 B2 | 6/2011 | Capps, Jr. et al. | |
| 8,166,320 B2 | 4/2012 | Gabor et al. | |
| 2004/0073438 A1* | 4/2004 | Fox et al. | 705/1 |
| 2005/0187727 A1* | 8/2005 | Weik et al. | 702/61 |
| 2007/0159970 A1 | 7/2007 | Chilukoor | |
| 2007/0173039 A1 | 7/2007 | Tagusa | |
| 2007/0293969 A1 | 12/2007 | Hirai et al. | |
| 2008/0148076 A1 | 6/2008 | Gabor et al. | |
| 2009/0164812 A1 | 6/2009 | Capps, Jr. et al. | |
| 2009/0193424 A1 | 7/2009 | Shen et al. | |
| 2010/0050429 A1* | 3/2010 | Maenishi | 29/832 |
| 2010/0146314 A1 | 6/2010 | Gabor et al. | |

FOREIGN PATENT DOCUMENTS

| | | |
|---|---|---|
| CN | 101167373 | 4/2008 |
| CN | 101221495 | 7/2008 |
| CN | 101464721 | 6/2009 |
| JP | 4-138026 | 5/1992 |
| JP | 11-232332 | 8/1999 |
| JP | 2001-197661 | 7/2001 |
| JP | 2006-261646 | 9/2006 |
| JP | 2006-277131 | 10/2006 |
| JP | 2006-313806 | 11/2006 |
| JP | 2010-62398 | 3/2010 |
| WO | 2006/088032 | 8/2006 |

OTHER PUBLICATIONS

International Search Report issued Apr. 26, 2011 in International (PCT) Application No. PCT/JP2011/001669.

Chinese Office Action (with English translation) issued Oct. 9, 2014 in the corresponding Chinese Patent Application No. 201180002801.6.

* cited by examiner

MOUNTING-LINE POWER CONTROL DEVICE AND MOUNTING-LINE POWER CONTROL METHOD

TECHNICAL FIELD

The present invention relates to mounting-line power control devices and mounting-line power control methods which are for controlling power used by a mounting line group that includes a plurality of mounting lines. Each of the mounting lines includes component-mounted board production apparatuses for producing a component-mounted board.

BACKGROUND ART

A factory which produces a component-mounted board on which a component is mounted includes a mounting line that includes component-mounted board production apparatuses such as a component mounting apparatus. Thus, such a factory is equipped with a large number of component-mounted board production apparatuses that use power, and consumes a large amount of power.

In view of this, conventionally, a power control device for suppressing an increase in power usage of the component-mounted board production apparatus has been proposed. For example, Patent Literature (PTL) 1 discloses a device which monitors power used by the component-mounted board production apparatuses to suppress an increase in power used by such apparatuses. Furthermore, PTL 2 discloses a device which performs control on air conditioning equipment, refrigeration equipment, and lighting equipment with time differences to suppress an increase in power used by such equipment. Furthermore, PTL 3 discloses a device which takes into account power consumption to perform control, that is, the device determines, for a component mounting apparatus included in the mounting line, the number of beams used in such a manner that a target production time is not exceeded.

CITATION LIST

Patent Literature

[PTL 1]
Japanese Unexamined Patent Application Publication No. 2006-277131
[PTL 2]
Japanese Unexamined Patent Application Publication No. 2001-197661
[PTL 3]
Japanese Unexamined Patent Application Publication No. 2006-261646

SUMMARY OF INVENTION

Technical Problem

There are cases where the component-mounted board production factory includes a plurality of mounting lines such that a plurality of component-mounted boards can be produced in parallel. The above-described conventional power control devices are not for suppressing increase in power used by the totality of the mounting lines.

In other words, the device disclosed in PTL 2 suppresses increase in power usage by controlling single equipment such as air conditioning equipment, refrigeration equipment, and lighting equipment. Furthermore, the device disclosed in PTL 3 suppresses increase in power usage of the component-mounted board production apparatuses included in single mounting line. Furthermore, the device disclosed in above-described PTL 1 is a device for monitoring power usage, and not a device for suppressing an increase in power usage.

Thus, the above-described conventional power control devices are not for suppressing an increase in power used by the totality of the mounting lines. This leads to a problem that the increase in power used by the totality of the mounting lines cannot be efficiently controlled in some cases.

The present invention has been conceived in view of the aforementioned problem and has an object to provide a mounting-line power control device and a mounting-line power control method with which increase in power used by the totality of the mounting lines can be efficiently suppressed.

Solution to Problem

In order to achieve the aforementioned object, a mounting-line power control device according to an aspect of the present invention is a mounting-line power control device which controls power used by a mounting line group including a plurality of mounting lines each of which includes a component-mounted board production apparatus for producing a component-mounted board on which a component is mounted. The mounting-line power control device includes: a target value obtaining unit configured to obtain, for each of the mounting lines, a target value for demand power which indicates power energy used in a first period; a priority obtaining unit configured to obtain a first priority level that is a priority level of each of the mounting lines for use of power; a target value changing unit configured to decrease the target value for the demand power used by a second mounting line in the first period when the demand power used by a first mounting line in the first period exceeds the target value for the first mounting line in the first period, the first mounting line being included in the mounting line group, and the second mounting line being included in the mounting line group and having the first priority level lower than the first priority level of the first mounting line; and a power usage changing unit configured to reduce power used in the first period by the component-mounted board production apparatus which is included in the second mounting line, such that the demand power used by the second mounting line in the first period does not exceed the decreased target value for the second mounting line in the first period.

With this, when the demand power used by the first mounting line exceeds in the first period the target value for the first mounting line in the first period, the mounting-line power control device decreases the target value for the demand power used by the second mounting line and reduces the power used by the component-mounted board production apparatus included in the second mounting line such that power usage does not exceed the decreased target value for the second mounting line in the first period. Thus, power usage is increased or decreased among the mounting lines. In this way, increase in power used by the totality of the mounting lines can be efficiently suppressed.

Furthermore, it is preferable that the second mounting line include a plurality of component-mounted board production apparatuses including the component-mounted board production apparatus, the priority obtaining unit be further configured to obtain a second priority level that is a priority level of each of the component-mounted board production apparatuses for use of power, and the power usage changing unit be configured to (i) determine power saving equipment in ascending order of the second priority level, and (ii) reduce power used by the determined power saving equipment in the first period until the demand power used by the second mounting line in the first period is equal to or smaller than the decreased target value for the second mounting line in the first period, the power saving equipment being the component-mounted board production apparatus of which power usage in the first period is reduced among the component-mounted board production apparatuses included in the second mounting line. Furthermore, it is preferable that the power saving equipment include a plurality of apparatuses, and the power usage changing unit be configured to reduce power used in the first period by stopping, during the first period, operation of a power saving apparatus that is one of the apparatuses included in the power saving equipment.

With this, in the first period, until the demand power used by the second mounting line is equal to or smaller than the decreased target value for the second mounting line in the first period, the mounting-line power control device determines the power saving equipment in ascending order of the second priority level and reduce the power usage by stopping operation of the apparatus included in the determined power saving equipment. With this, by reducing the power used by the mounting substrate production apparatuses in ascending order of priority level, it is possible to efficiently suppress the increase in power used by the totality of the mounting lines.

Furthermore, it is preferable that the target value obtaining unit be further configured to obtain the target value for the demand power used by the second mounting line in a second period that is different from the first period, and the power usage changing unit be further configured to increase power used by the power saving equipment in the second period, when the increase in the power used by the power saving equipment in the second period does not cause the demand power used by the second mounting line in the second period to exceed the target value for the second mounting line in the second period.

With this, when the demand power does not exceed the target value even when the power used by the power saving equipment is increased in the second period, the mounting-line power control device increases the power used by the power saving equipment in the second period. With this, the operations of the power saving equipment which are originally scheduled to be performed in the first period can be performed in the second period without exceeding the target value. Thus, it is possible to efficiently suppress the increase in power used by the totality of the mounting lines.

Furthermore, it is preferable that the target value changing unit be configured: to judge whether or not the first period is included in a discount period during which a unit price of electricity charges is discounted, and to decrease, when judging that the first period is not included in the discount period, the target value for the demand power used by the second mounting line in the first period, and not to decrease, when judging that the first period is included in the discount period, the target value for the demand power used by the second mounting line in the first period.

With this, the mounting-line power control device (i) decreases, when the first period is not included in the discount period, the target value for the demand power used by the second mounting line in the first period and (ii) does not decrease, when the first period is included in the discount period, the target value for the demand power used by the second mounting line in the first period. Stated differently, during a period of time other than the discount period, a large amount of power is used in a factory. Thus, the mounting-line power control device decreases the target value for the demand power used by the second mounting line. Furthermore, during the discount period during which a factory uses less power, the mounting-line power control device does not decrease the target value for the demand power used by the second mounting line. Thus, by switching for each time periods, it is possible to efficiently suppress the increase in power used by the totality of the mounting lines.

Furthermore, it is preferable that, when the target value for the demand power used by the first mounting line in the first period is decreased, the target value changing unit be further configured to increase the target value for the demand power used in the first period by a third mounting line that is included in the mounting line group and different from the first mounting line.

With this, when the target value for the demand power used by the first mounting line is decreased in the first period, the mounting-line power control device increases the target value for the demand power used by the mounting line different from the first mounting line. Thus, power usage is increased or decreased among the mounting lines. In this way, increase in power used by the totality of the mounting lines can be efficiently suppressed.

It is to be noted that the present invention can be implemented not only as the mounting-line power control device, but also as a mounting-line power control method having, as steps, characteristic processing performed by processing unit included in the mounting-line power control device. Furthermore, the present invention can be implemented as a program and an integrated circuit which cause a computer to execute such a characteristic processing included in the mounting-line power control method. In addition, it goes without saying that such a program may be distributed via a recording medium such as a CD-ROM and a communication network such as the Internet.

ADVANTAGEOUS EFFECTS OF INVENTION

The mounting-line power control device according to the present invention controls power used by a plurality of mounting lines each of which includes component-mounted board production apparatuses for producing a component-mounted board, and can efficiently suppress increase in power used by the totality of the mounting lines.

DESCRIPTION OF EMBODIMENT

The following describes a mounting-line power control device according to an embodiment of the present invention with reference to drawings.

Figure 1:
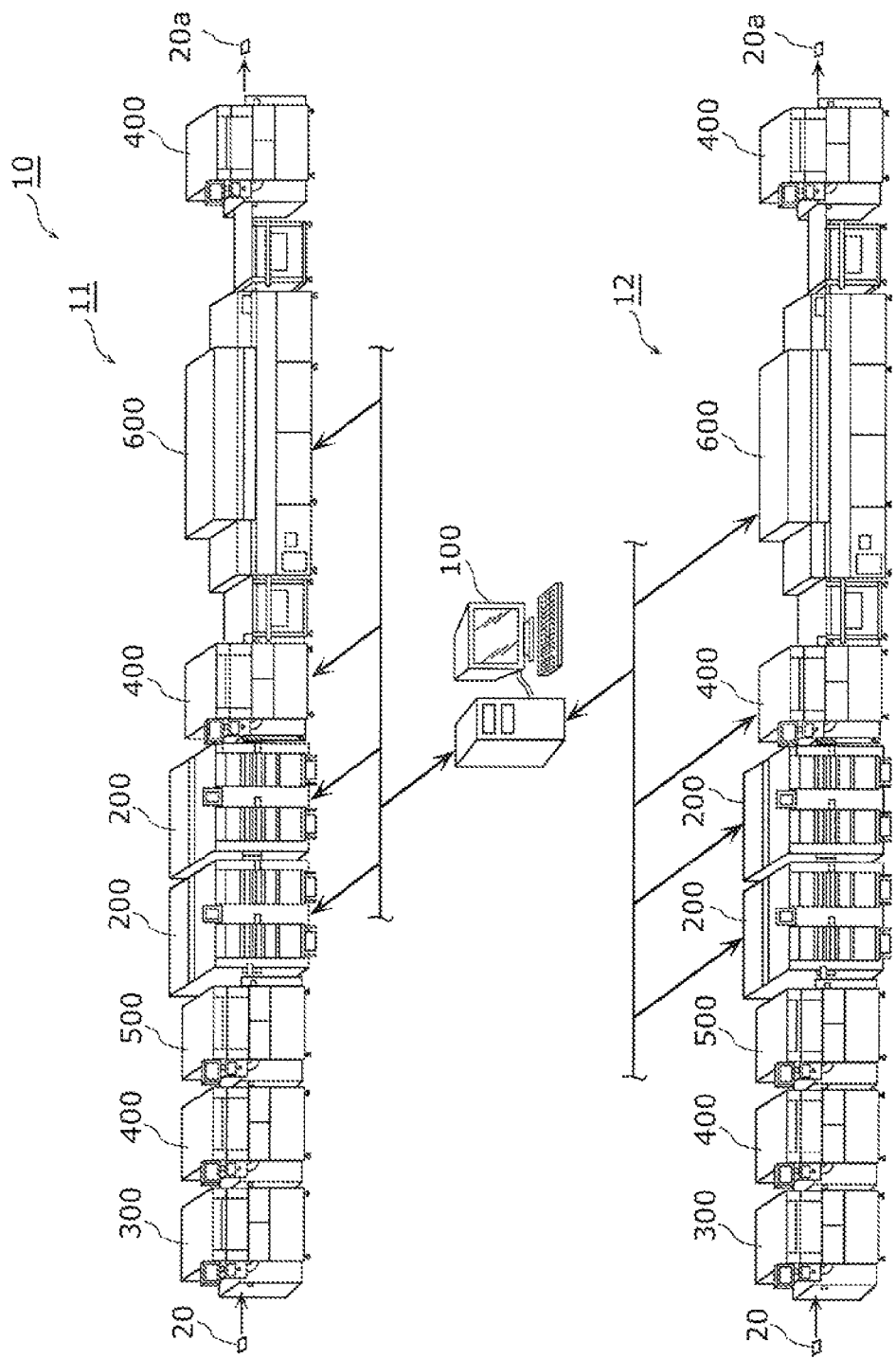
FIG. 1 is an external view showing a structure of a mounting line group which includes a mounting-line power control device according to an embodiment of the present invention.

FIG. 1 is an external view showing a structure of a mounting line group 10 which includes a mounting-line power control device 100 according to an embodiment of the present invention.

As shown in the drawing, the mounting line group 10 includes a mounting line 11, a mounting line 12, and the mounting-line power control device 100. It is to be noted that, although the mounting line group 10 includes two mounting lines, that is, the mounting line 11 and the mounting line 12 here, the mounting line group 10 may include three or more mounting lines.

The mounting line 11 is a production line which transports a board from an upstream side component-mounted board production apparatus to a downstream side component-mounted board production apparatus and produces a component-mounted board that is a board on which a component such as an electronic component is mounted. The mounting line 11 includes, as the component-mounted board production apparatuses, two component mounting apparatuses 200, a printing apparatus 300, three inspection apparatuses 400, an adhesive applicator 500, and a reflow furnace 600.

The component mounting apparatus 200 is an apparatus which mounts a component onto a board. Specifically, the component mounting apparatuses 200 transport the board from an upstream side to a downstream side and mount the component onto the board. In other words, the component mounting apparatus 200 located upstream receives the board first, and mounts the component onto the board. Then, the board on which the component is mounted is sent out to the component mounting apparatus 200 located downstream. Thus, the board is transported to each of the component mounting apparatuses 200 sequentially and the components are mounted onto the board.

The printing apparatus 300 is a screen printer which receives a board 20 from a stocker in which boards are stocked (not illustrated), and screen printing solder paste onto a surface of the board 20. The solder paste is a solder in the form of paste.

The adhesive applicator 500 is an apparatus which applies adhesive onto the board.

The reflow furnace 600 is an apparatus which melts the solder or the like by heating the board 20 on which the component is mounted, and then fixes the component onto the board.

The inspection apparatus 400 is an apparatus which inspects a condition of the surface of the board. Specifically, the three inspection apparatuses 400 included are: the inspection apparatus 400 which inspects external appearance of the soldering performed by the printing apparatus 300; the inspection apparatus 400 which inspects a condition of the components on the board that are mounted by the component mounting apparatuses 200; and the inspection apparatuses 400 which inspects a condition of the surface of the board after heat treatment is performed by the reflow furnace 600.

Furthermore, a component-mounted board 20a on which the components are mounted and inspection is performed by the inspection apparatus 400 is sent to a stocker in which the board is stocked (not illustrated).

Furthermore, the mounting line 12 has the same or alike structure and the same or alike function as those of the mounting line 11. Thus, detailed description thereof is omitted.

The mounting-line power control device 100 is a control device which controls power used by the mounting line group 10. In other words, the mounting-line power control device 100 controls power used by the mounting line 11 and the mounting line 12. It is to be noted that details of the mounting-line power control device 100 will be described later.

The following describes the detail of structure of the mounting-line power control device 100.

Figure 2:
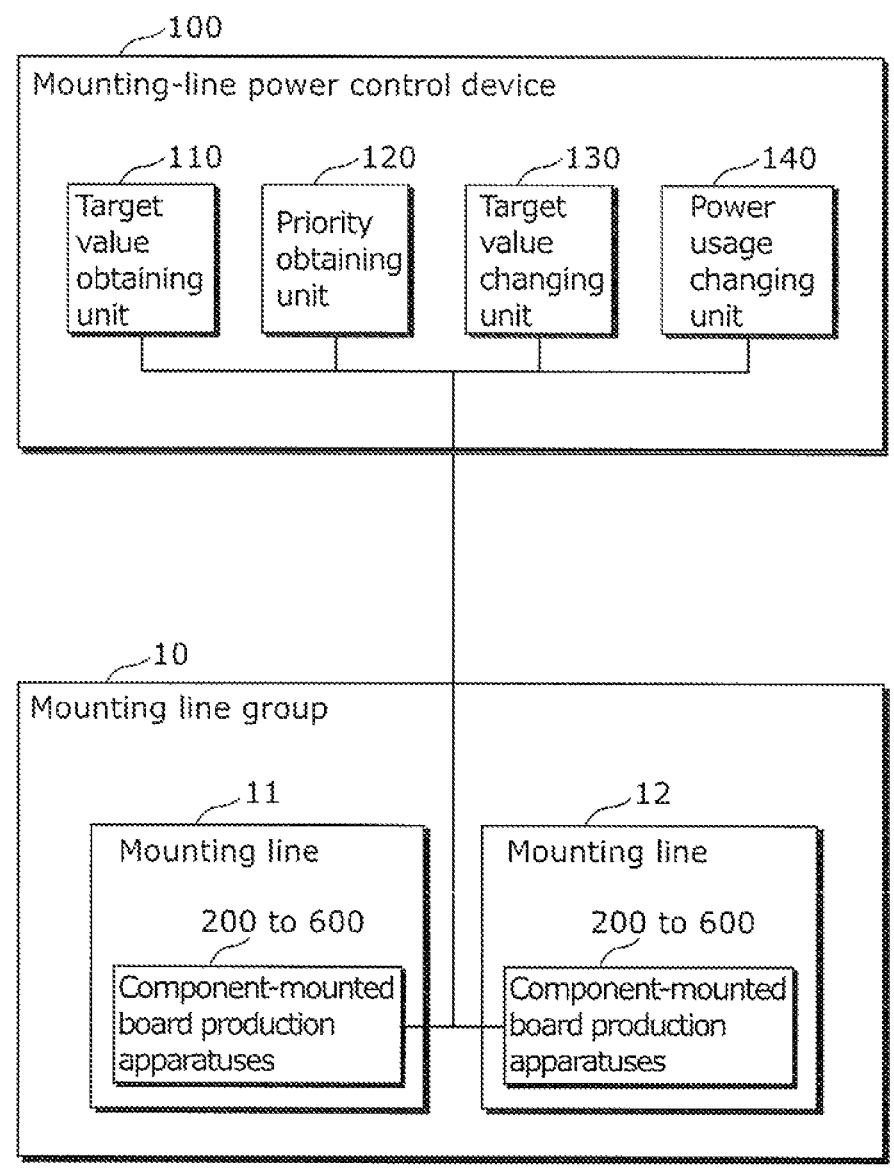
FIG. 2 is a block diagram showing a functional component of the mounting-line power control device according to the embodiment.

FIG. 2 is a block diagram showing a functional component of the mounting-line power control device 100 according to this embodiment.

The mounting-line power control device 100 is a computer which controls power used by the mounting line group 10. It is to be noted that the mounting-line power control device 100 may be implemented by a general-purpose computer system such as a personal computer by executing a program or may be implemented by a dedicated computer system.

As shown in the drawing, the mounting-line power control device 100 includes a target value obtaining unit 110, a priority obtaining unit 120, a target value changing unit 130, and a power usage changing unit 140.

The target value obtaining unit 110 obtains, for each of the mounting lines, a target value for demand power. The demand power indicates power energy used in each of predetermined periods. In other words, the target value obtaining unit 110 obtains the target values for the demand power used by the mounting line 11 and the mounting line 12. It is to be noted that, in the case where the mounting line group 10 includes three or more mounting lines, the target value obtaining unit 110 obtains the target values for the demand power used by the three or more mounting lines.

It is to be noted that the target value may be determined by a user in advance or may be calculated by the target value obtaining unit 110. Furthermore, the target value may vary or may be the same for each predetermined period (e.g., one shift, one day, one week, one month or the like).

Here, a detailed description is given of the demand power and its target value.

Figure 3:
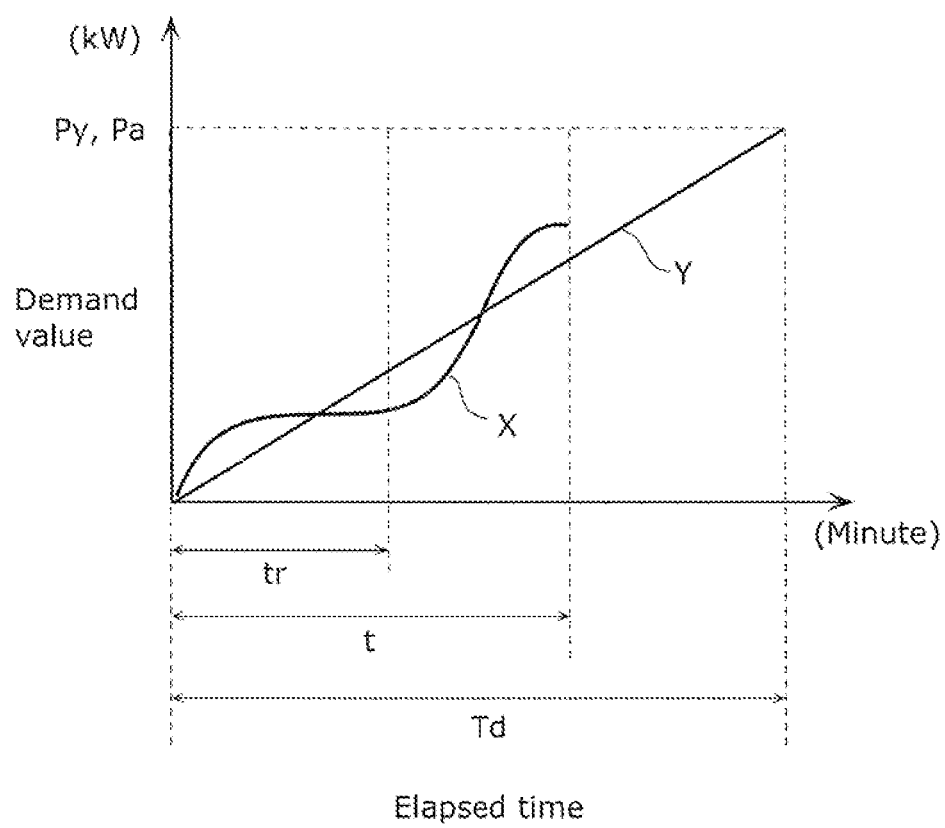
FIG. 3 is a graph for describing demand power and its target value.

FIG. 3 is a graph for describing the demand power and its target value.

A curve X shown in the drawing indicates a change in current power Pt (kW). The current power Pt at elapsed time t (minute) is calculated by the following equation.

Current power $Pt$=(power energy at elapsed time $t$−power energy at elapsed time $0$)×2 (Equation 1)

The demand power is the current power Pt when the elapsed time t is a demand period Td. Here, the demand period Td is 30 minutes. In other words, the demand power is a value that indicates power energy used per 30 minutes, and measured every 30 minutes.

Furthermore, a straight line Y indicates a change in reference power Py (kW) that is the target value for the current power Pt. The reference power Py at elapsed time t is calculated by the following equation.

$$\text{Reference power } Py = \text{target power } Pa \times \text{elapsed time } t/30 \quad \text{(Equation 2)}$$

In other words, the target power Pa (kW) is the reference power Py when the elapsed time t is the demand period Td. It is to be noted that the target power Pa is specified for per 30 minutes that is when the demand power is measured.

Furthermore, when the current power Pt at elapsed time t is equal to or larger than the reference power Py at elapsed time t, a demand warning is issued. In other words, when it is estimated that the demand power exceeds the target power Pa, the demand warning is issued. It is to be noted that a lock period tr is a period during which the warning is suppressed. When the elapsed time t is within the lock period tr, the demand warning is not issued or, even when the warning is issued, the warning is cancelled.

In FIG. 2, the priority obtaining unit 120 obtains: a first priority level that is a priority level of each of the mounting lines for use of power; and a second priority level that is a priority level of each of the component-mounted board production apparatuses for use of power. In other words, between the mounting lines 11 and 12, the mounting line having the higher first priority level can preferentially use power. Furthermore, among the component-mounted board production apparatuses 200 to 600, the component-mounted board production apparatus having the higher second priority level can preferentially use power.

It is to be noted that the first priority level and the second priority level may be determined by a user in advance or may be calculated by the priority obtaining unit 120. Furthermore, the first priority level and the second priority level may vary or may be the same for each predetermined period (e.g., one shift, one day, one week, one month or the like).

The target value changing unit 130 decreases the target value for the demand power used by a second mounting line in the first period when the demand power used by a first mounting line in the first period exceeds the target value for the first mounting line in the first period. The first mounting line is included in the mounting line group 10. The second mounting line is included in the mounting line group 10 and has the first priority level lower than the first priority level of the first mounting line. Here, the first period is one of plurality of periods for which demand power are measured, and is one of the predetermined periods (e.g., one shift, one day, one week, one month or the like) for which the target value obtaining unit 110 obtains the target values for the demand power.

For example, when, in the first period, the mounting line 11 has the first priority level higher than the first priority level of the mounting line 12 and it is estimated that the demand power used by the mounting line 11 exceeds the target value for the mounting line 11 in the first period, the target value changing unit 130 decreases a target value for the demand power used by the mounting line 12. The first priority level is a priority level of each of the mounting lines for use of power.

Here, the target value changing unit 130 judges whether or not the first period is included in a discount period during which a unit price of electricity charges is discounted, and to decrease, when judging that the first period is not included in the discount period, the target value for the demand power used by the second mounting line in the first period, and not to decrease, when judging that the first period is included in the discount period, the target value for the demand power used by the second mounting line in the first period. Here, the discount period is, for example, late night hours. In other words, the target value changing unit 130 has a function of automatically switching between two power modes, that is, a day power mode and a late night power mode.

Further, when the target value for the demand power used by the first mounting line in the first period is decreased, the target value changing unit 130 can increase the target value for the demand power used in the first period by a third mounting line that is included in the mounting line group and different from the first mounting line.

The power usage changing unit 140 reduces power used in the first period by the component-mounted board production apparatus which is included in the second mounting line, such that the demand power used by the second mounting line in the first period does not exceed the decreased target value for the second mounting line in the first period.

Specifically, the power usage changing unit 140 (i) determines power saving equipment in ascending order of the second priority level, and (ii) reduces power used by the determined power saving equipment in the first period until the demand power used by the second mounting line in the first period is equal to or smaller than the decreased target value for the second mounting line in the first period. The power saving equipment is the component-mounted board production apparatus of which power usage in the first period is reduced among the component-mounted board production apparatuses included in the second mounting line. The second priority level is a priority level of each of the component-mounted board production apparatuses for use of power. More specifically, the power usage changing unit 140 reduces power used in the first period by stopping, during the first period, operation of a power saving apparatus that is one of the apparatuses included in the power saving equipment.

In addition, further, the power usage changing unit 140 increases power used by the power saving equipment in a second period, when the increase in the power used by the power saving equipment in the second period does not cause the demand power used by the second mounting line in the second period to exceed the target value for the second mounting line in the second period. Here, the second period is one of the plurality of periods for which demand power are measured and different from the first period, and is one of the predetermined periods (e.g., one shift, one day, one week, one month or the like) for which the target value obtaining unit 110 obtains the target values for the demand power and different from the first period.

Next, processing performed by the mounting-line power control device 100 is described.

Figure 4:
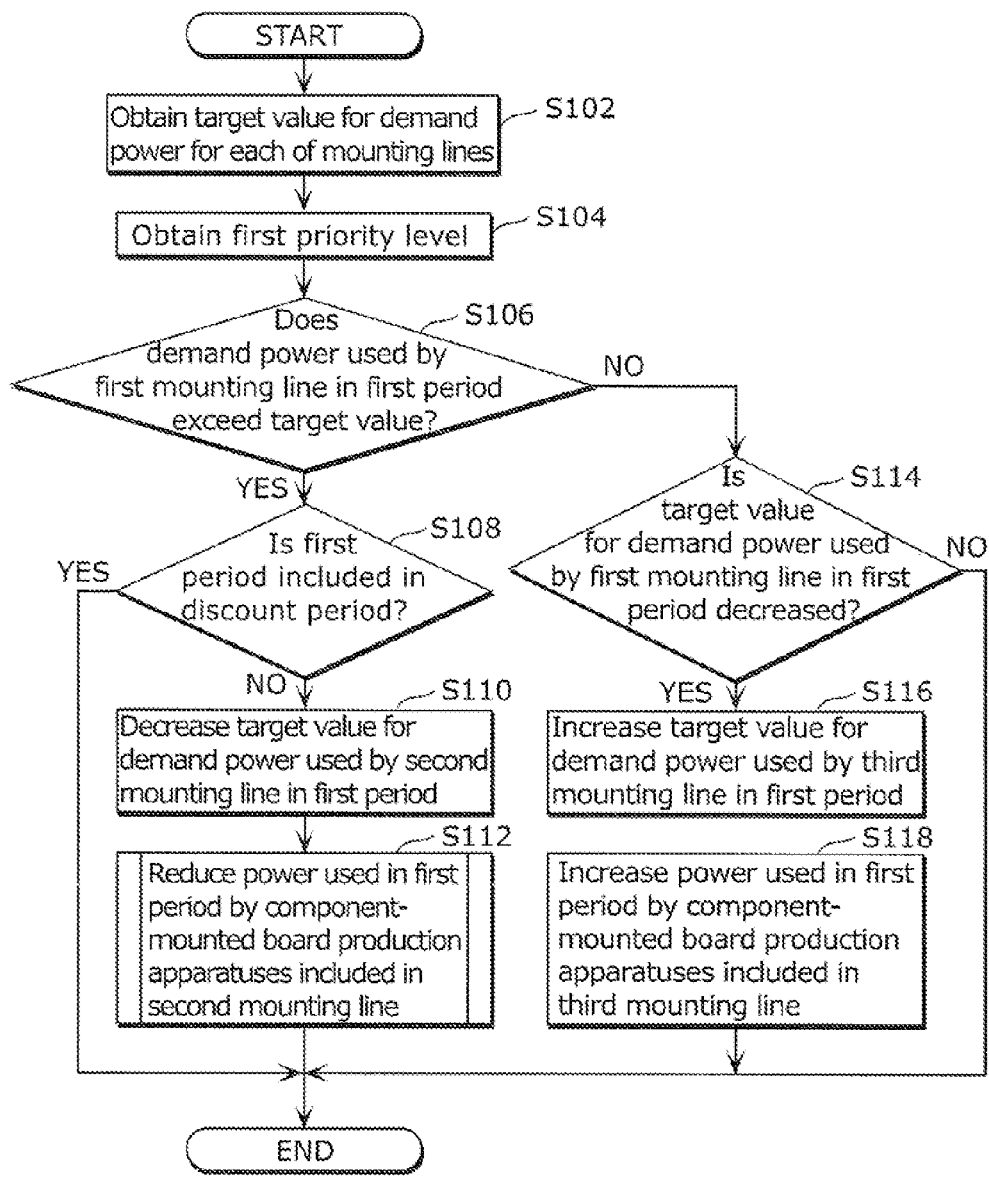
FIG. 4 is a flowchart showing an example of an operation performed by the mounting-line power control device according to the embodiment.

FIG. 4 is a flowchart showing an example of an operation performed by the mounting-line power control device 100 according to this embodiment.

Figure 5:
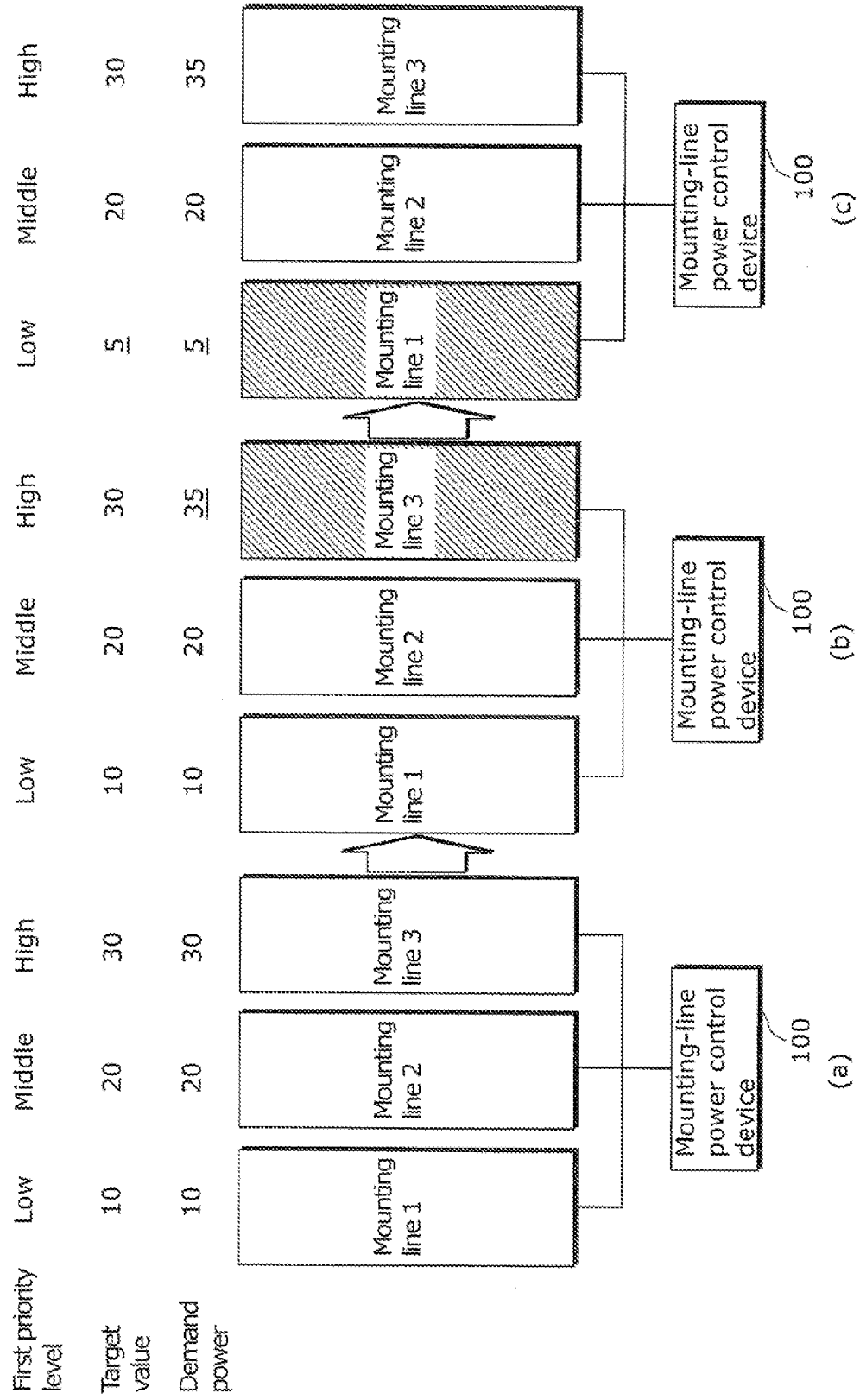
FIG. 5 is a diagram which illustrates processing performed by the mounting-line power control device according to the embodiment.
Figure 6:
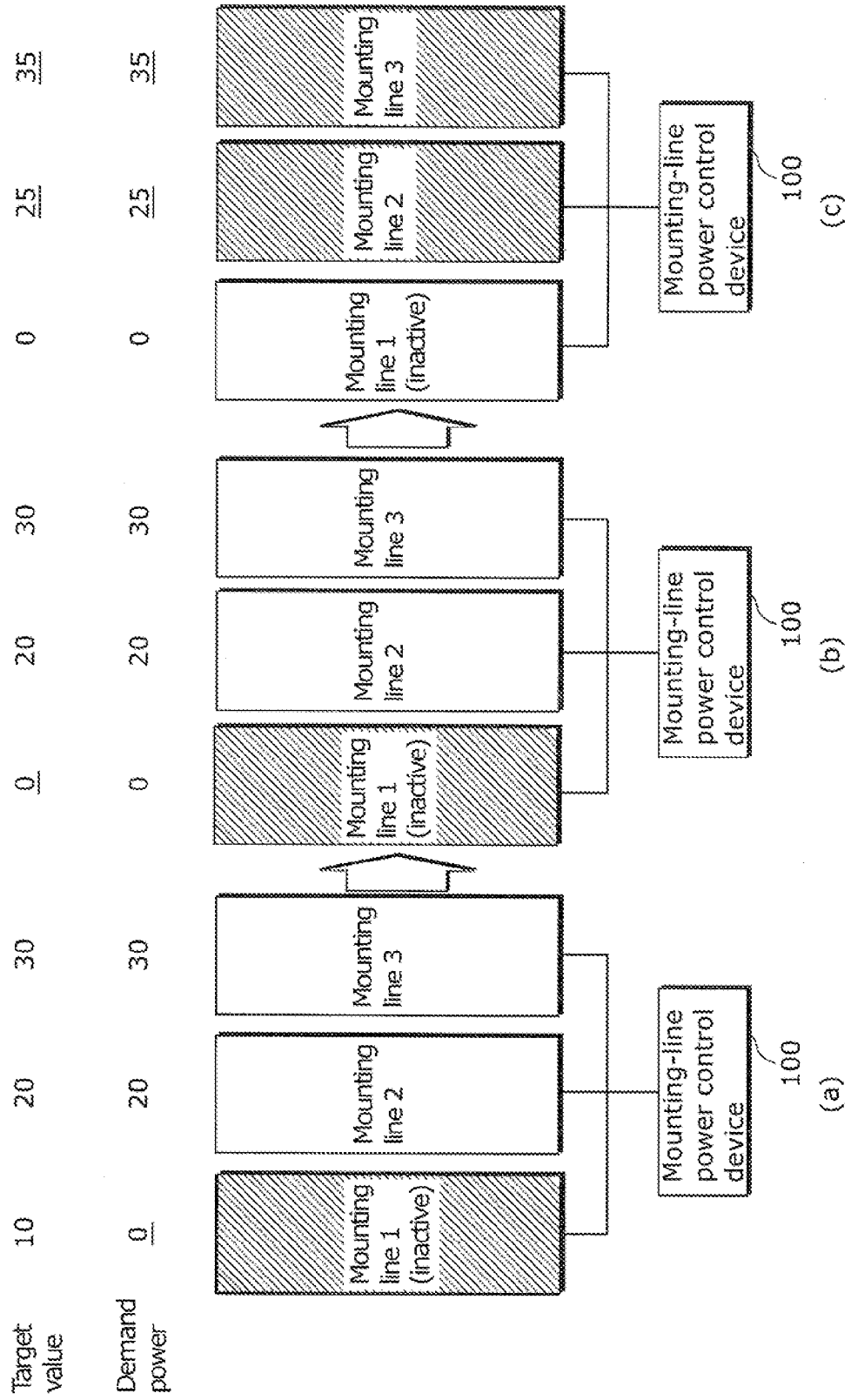
FIG. 6 is a diagram which illustrates processing performed by the mounting-line power control device according to the embodiment.

FIG. 5 and FIG. 6 are diagrams which illustrate processing performed by the mounting-line power control device 100 according to this embodiment.

As shown in FIG. 4, first, the target value obtaining unit 110 obtains the target value for the demand power for each of the mounting lines (S102). For example, as shown in (a) in FIG. 5, when the mounting line group 10 includes three mounting lines (a mounting line 1, a mounting line 2, and a mounting line 3 shown in the drawing), the target value obtaining unit 110 obtains the target values for the demand power used by the three mounting lines, respectively. In the drawing, the target value obtaining unit 110 obtains 10, 20, and 30 as the target value for the demand power used by the mounting line 1, the mounting line 2, and the mounting line 3, respectively.

Furthermore, the priority obtaining unit 120 obtains the first priority level (S104). For example, as shown in (a) in FIG. 5, the priority obtaining unit 120 obtains "low", "medium", and "high" as the first priority level of the mounting line 1, the mounting line 2, and the mounting line 3, respectively.

Next, the target value changing unit 130 judges whether or not the demand power used by the first mounting line in the first period exceeds the target value for the first mounting line in the first period (S106). The first mounting line is a mounting line included in the mounting line group 10. Specifically, as shown in FIG. 3, when the current power Pt of the first mounting line at the elapsed time t within the first period is equal to or larger than the reference power Py, the target value changing unit 130 judges that the demand power exceeds the target power Pa.

For example, as shown in (b) in FIG. 5, when it is estimated that the demand power used by the mounting line 3 exceeds the target value, the target value changing unit 130 regards the mounting line 3 as the first mounting line, and judges that the demand power used by the first mounting line exceeds the target value.

In addition, when judging that the demand power used by the first mounting line exceeds the target value (YES in S106), the target value changing unit 130 judges whether or not the first period is included in the discount period (S108).

In addition, when judging that the first period is not included in the discount period (NO in S108), the target value changing unit 130 decreases the target value for the demand power used by the second mounting line in the first period (S110).

For example, as shown in (c) in FIG. 5, the target value changing unit 130 regards the mounting line 1 as the second mounting line, and decreases the target value for the demand power used by the mounting line 1. Specifically, the target value changing unit 130 decreases the target value for the demand power used by the mounting line 1 such that the amount of decrease in the target value for the demand power used by the mounting line 1 is equal to the amount of increase in the demand power used by the first mounting line.

Next, the power usage changing unit 140 reduces power used in the first period by the component-mounted board production apparatuses included in the second mounting line, such that the demand power used by the second mounting line in the first period does not exceed the decreased target value (S112).

Specifically, as shown in (c) in FIG. 5, the power usage changing unit 140 reduces the power used by the component-mounted board production apparatuses included in the mounting line 1, which is the second mounting line, such that the demand power used by the mounting line 1 is equal to or smaller than the decreased target value. It is to be noted that the detail of the processing performed by the power usage changing unit 140 to reduce the power used in the first period by the component-mounted board production apparatuses included in the second mounting line will be described later.

Furthermore, when judging that the first period is included in the discount period (YES in S108), the target value changing unit 130 ends the processing without decreasing the target value for the demand power used by the second mounting line in the first period.

Furthermore, when judging that the demand power used by the first mounting line is equal to or less than the target value (NO in S106), the target value changing unit 130 judges whether or not the target value for the demand power used by the first mounting line in the first period is decreased (S114).

For example, as shown in (a) in FIG. 6, when the mounting line 1 is inactive and its demand power is zero, the target value changing unit 130 decreases, as shown in (b) in FIG. 6, the target value for the demand power used by the mounting line 1. In this case, the target value changing unit 130 regards the mounting line 1 as the first mounting line, and judges that the target value for the demand power used by the first mounting line is decreased.

In addition, when judging that the target value for the demand power used by the first mounting line in the first period is decreased (YES in S114), the target value changing unit 130 increases the target value for the demand power used by the third mounting line in the first period (S116). The third mounting line is a mounting line different from the first mounting line.

Specifically, as shown in (c) in FIG. 6, the target value changing unit 130 regards the mounting line 2 and the mounting line 3 as the third mounting lines, and increases the target values for the demand power used by the mounting line 2 and the mounting line 3. Here, the target value changing unit 130 increases the target values for the demand power used by the mounting line 2 and the mounting line 3, such that the amount of increase in the target values for the demand power used by the mounting line 2 and the mounting line 3 is equal to the amount of the decrease in the demand power used by the mounting line 1.

In addition, the power usage changing unit 140 increases, as necessary, the power used in the first period by the component-mounted board production apparatuses included in the third mounting line (S118). Thus, as shown in (c) in FIG. 6, the power usage changing unit 140 increases the demand power used by the mounting line 2 and the mounting line 3 in such a manner that the increased target values are not exceeded.

Furthermore, when judging that the target value for the demand power used by the first mounting line in the first period is not decreased (NO in S114), the target value changing unit 130 ends the processing without increasing the target value for the demand power used by the third mounting line in the first period.

This ends the processing which the mounting-line power control device 100 performs.

The following describes the processing performed by the power usage changing unit 140 to reduce the power used in the first period by the component-mounted board production apparatuses included in the second mounting line (S112 in FIG. 4).

Figure 7:
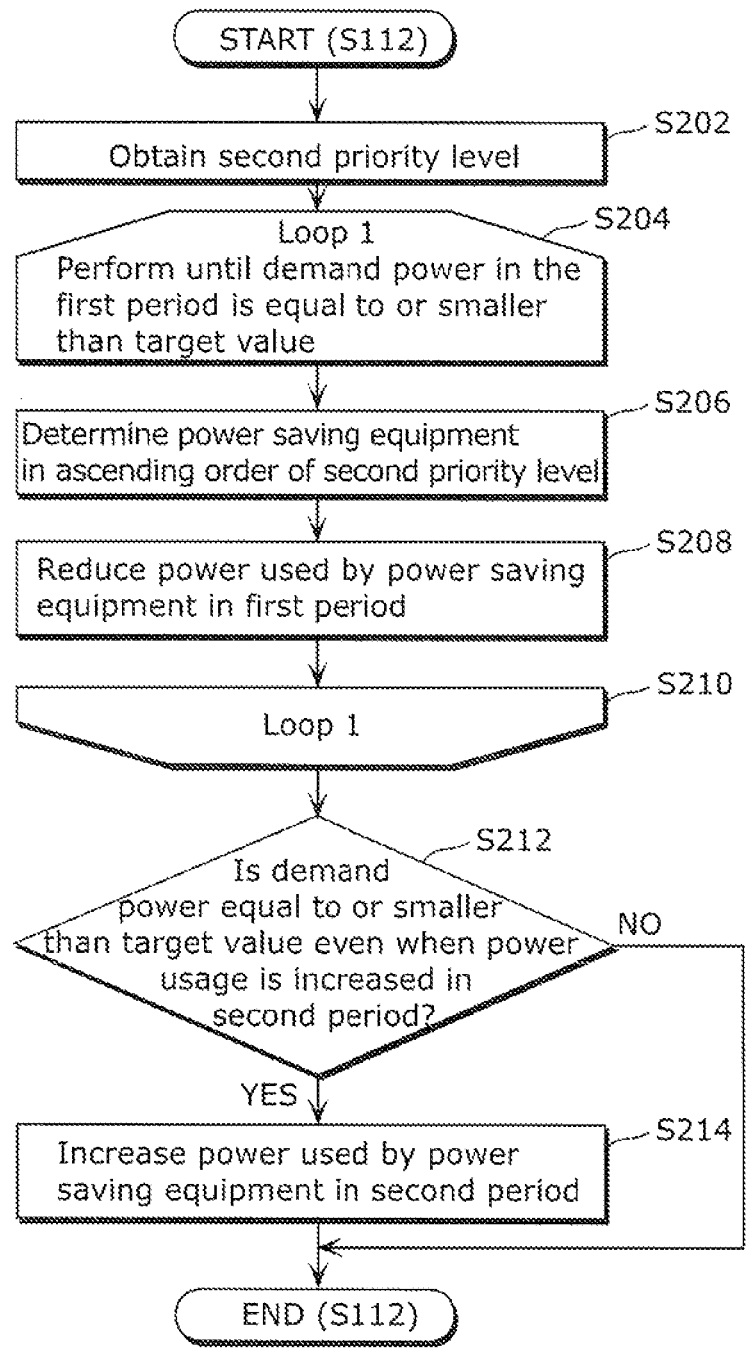
FIG. 7 is a flowchart showing an example of processing performed by a power usage changing unit according to the embodiment to reduce power used in a first period by a component-mounted board production apparatuses included in a second mounting line.

FIG. 7 is a flowchart showing an example of processing performed by a power usage changing unit 140 according to this embodiment to reduce power used in the first period by the component-mounted board production apparatuses included in the second mounting line.

Figure 8:
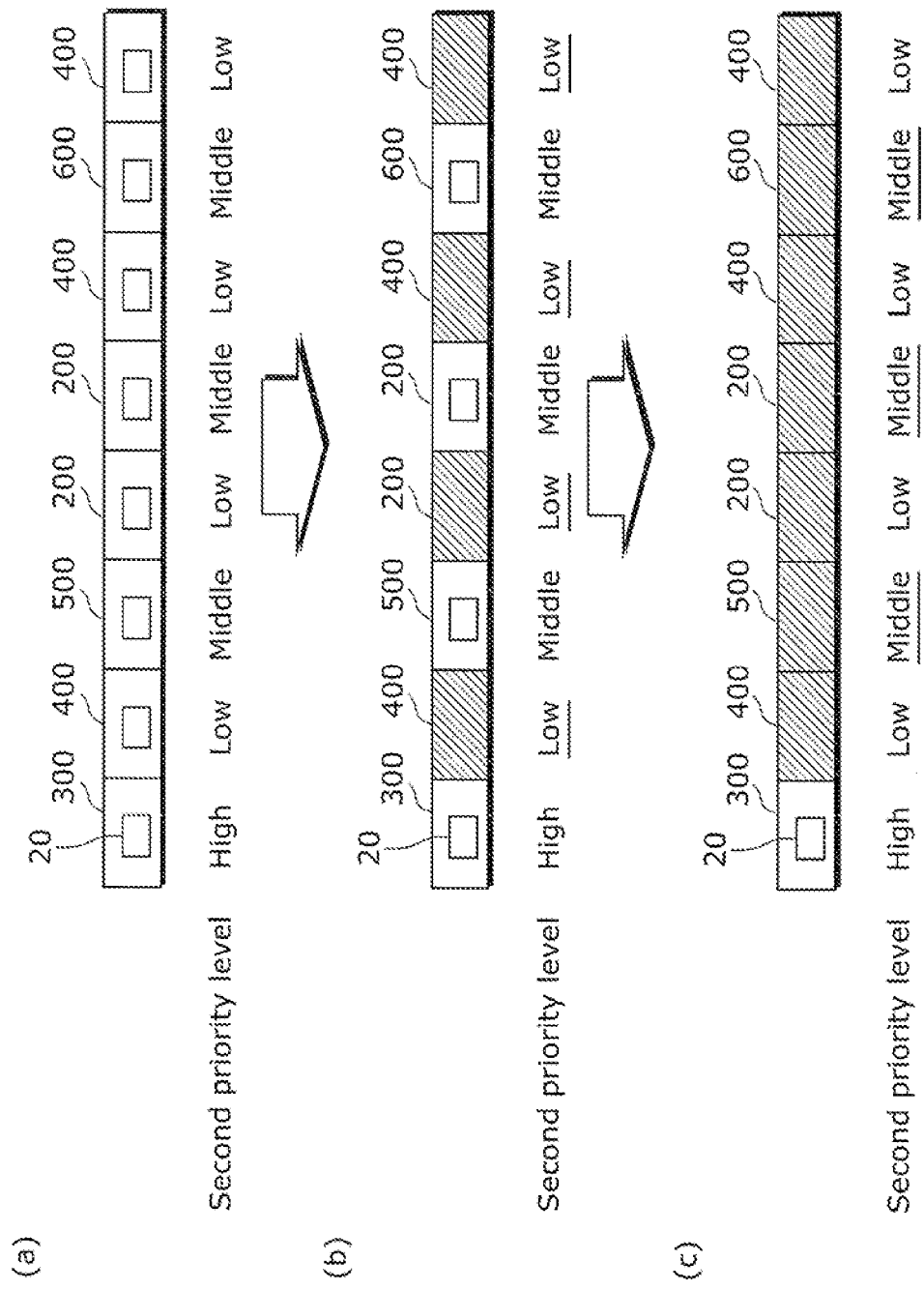
FIG. 8 is a diagram which illustrates processing performed by the power usage changing unit according to the embodiment to reduce power used in the first period by the component-mounted board production apparatuses included in the second mounting line.
Figure 9:
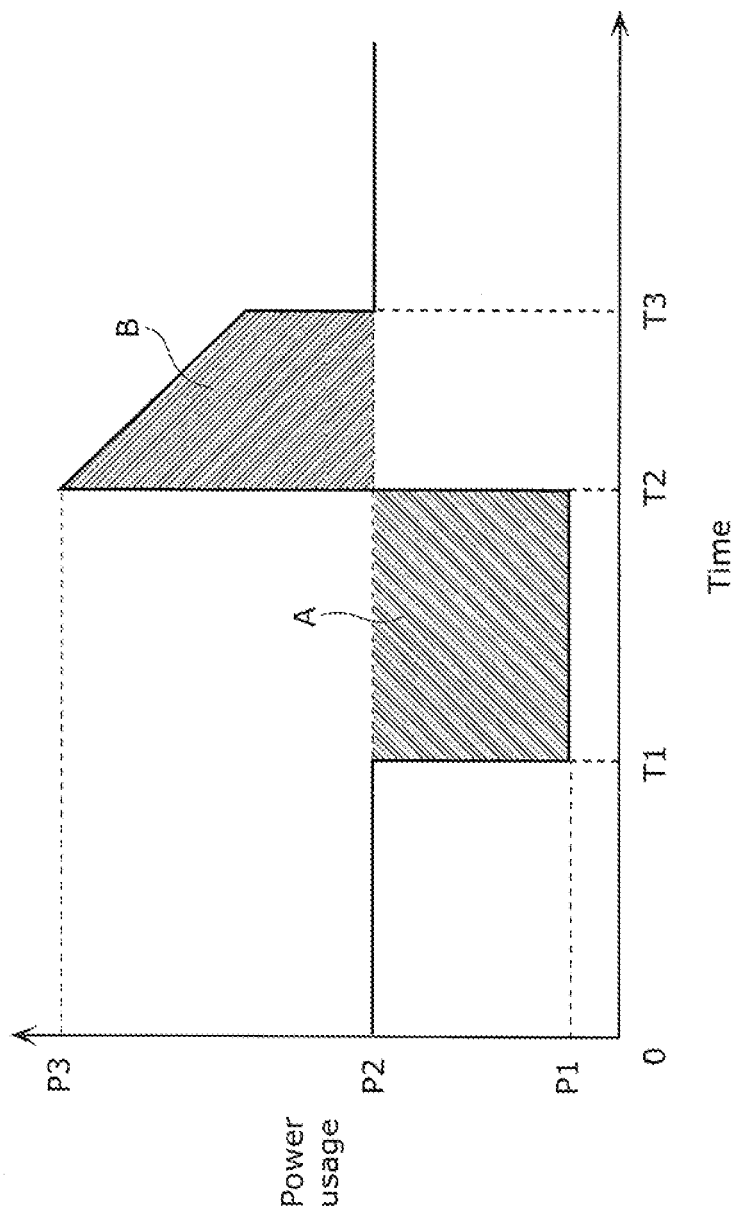
FIG. 9 is a graph which describes processing performed by the power usage changing unit according to the embodiment to reduce power used in the first period by the component-mounted board production apparatuses included in the second mounting line.
Figure 10:
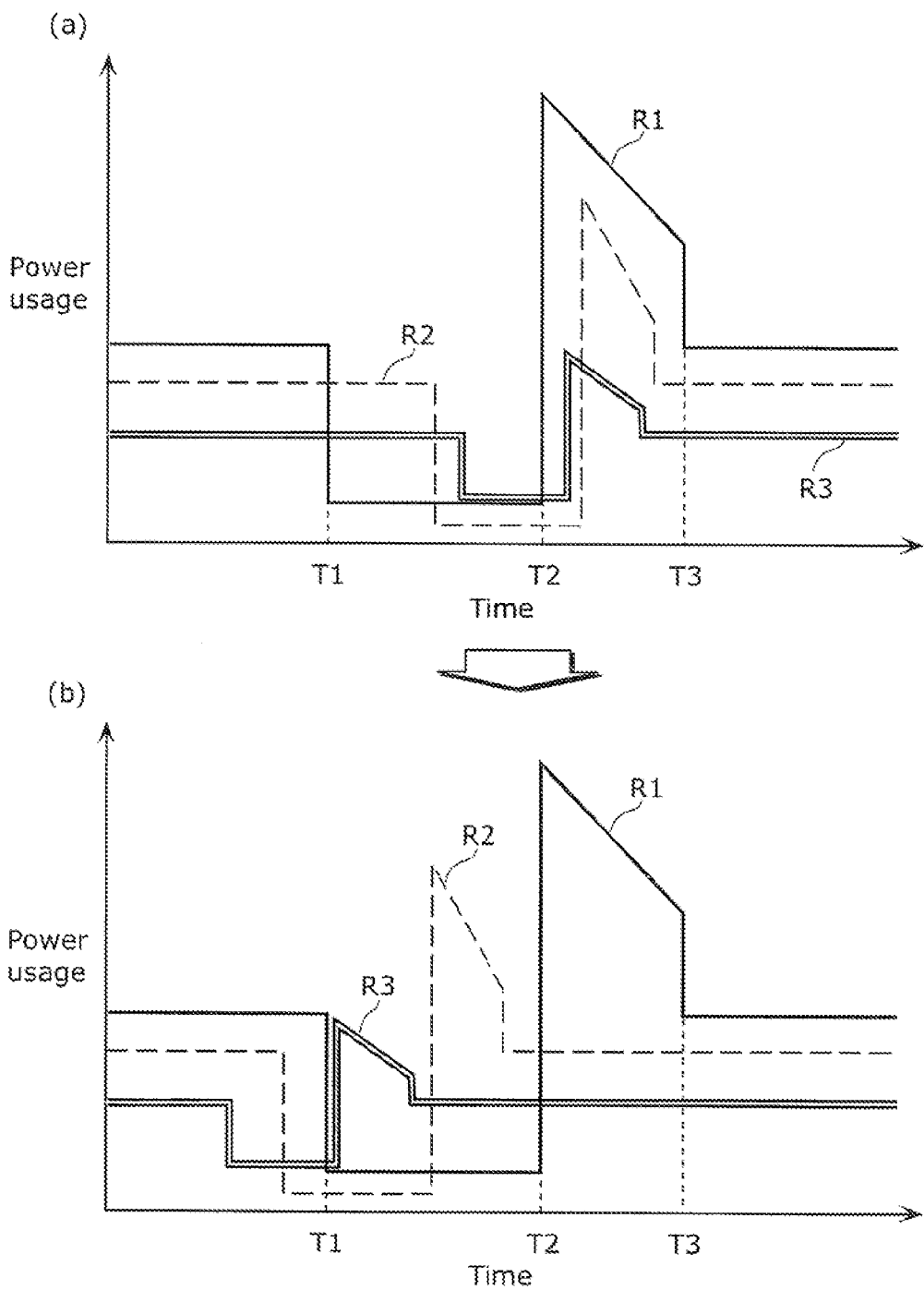
FIG. 10 is a graph which describes processing performed by the power usage changing unit according to the embodiment to reduce power used in the first period by the component-mounted board production apparatuses included in the second mounting line.

FIG. 8 to FIG. 10 are diagrams which describe processing performed by the power usage changing unit 140 according to this embodiment to reduce power used in the first period by the component-mounted board production apparatuses included in the second mounting line.

As shown in FIG. 7, first, the priority obtaining unit 120 obtains the second priority level for each of the component-mounted board production apparatuses included in the second mounting line (S202). For example, as shown in (a) in FIG. 8, the priority obtaining unit 120 obtains the second priority level for each of the component-mounted board production apparatuses 200 to 600.

In addition, the power usage changing unit 140 repeats the below-described processing until the demand power used by the second mounting line in the first period is equal to or smaller than the decreased target value for the second mounting line in the first period (loop 1: S204 to S210).

First, from among the component-mounted board production apparatuses included in the second mounting line, the power usage changing unit 140 determines the power saving equipment in ascending order of the second priority level. The power saving equipment is the component-mounted board production apparatus of which power usage in the first period is reduced (S206). For example, as shown in (a) in FIG. 8, the power usage changing unit 140 determines the component-mounted board production apparatuses of which second priority levels are "low" to be the power saving equipment (in the drawing, one component mounting apparatus 200 and three inspection apparatuses 400).

In addition, the power usage changing unit 140 reduces the power used by the power saving equipment in the first period (S208). Specifically, the power usage changing unit 140 reduces power used in the first period by stopping, during the first period, operation of the power saving apparatus that is one of the apparatuses included in the power saving equipment.

Specifically, as shown in (b) in FIG. 8, the power usage changing unit 140 stops, during the first period, the operation of the power saving apparatus that is apparatus included in the power saving equipment (cross-hatched component-mounted board production apparatuses shown in the drawing).

Here, when it is assumed that the component-mounted board production apparatus is the component mounting apparatus 200, the power saving apparatuses are, for example, a placing head and a feeder that supplies components to the placing head. In other words, for example, the power usage changing unit 140 causes power supply to a linear motor or the like that drives a feeder to be stopped, and thus reduces standby power of the motor.

Furthermore, when the demand power used by the second mounting line in the first period is not equal to or less than the target value for the second mounting line in the first period, the power usage changing unit 140 further determines the power saving equipment in ascending order of the second priority level (S206), and reduces power used by the determined power saving equipment in the first period (S208).

For example, as shown in (c) in FIG. 8, the power usage changing unit 140 determines the component-mounted board production apparatuses of which second priority level is "medium" (in the drawing, one each of the component mounting apparatus 200, the adhesive applicator 500, and the reflow furnace 600) to be the power saving equipment, and stops the operation of the power saving apparatuses during the first period.

As described, such as the cases where the boards 20 are sequentially fed ((a) in FIG. 8), the boards 20 are present in every other apparatuses ((b) in FIG. 8), and one board 20 is present in the mounting line ((c) in FIG. 8), the power usage changing unit 140 reduces power usage by limiting the number of the board 20 presents in the mounting line.

In addition, when the demand power used by the second mounting line in the first period is equal to or smaller than the target value for the second mounting line in the first period, the power usage changing unit 140 judges whether or not the demand power used by the second mounting line in the second period is equal to or smaller than the target value for the second mounting line in the second period even when power used by the power saving equipment is increased in the second period (S212).

When judging that the increase in the power used by the power saving equipment in the second period does not cause the demand power used by the second mounting line in the second period to exceed the target value for the second mounting line in the second period (YES in S212), the power usage changing unit 140 increases the power used by the power saving equipment in the second period (S214).

Here, the processing performed by the power usage changing unit 140 to increase the power used by the power saving equipment in the second period is specifically described with reference to FIG. 9 and FIG. 10. Note that the following description is given of the case where the power saving apparatus is the reflow furnace 600.

FIG. 9 is a graph showing power used when the reflow furnace 600 is stopped and started up.

As shown in the drawing, during time 0 to time T1, the reflow furnace 600 performs normal operation using power of power usage P2. Then, when the reflow furnace 600 is stopped at the time T1, power usage decreases to power of power usage P1. Then, when the reflow furnace 600 is started up at time T2, power usage increases to power of power usage P3. After that, the reflow furnace 600 is stabilized from time T3 and performs normal operation using the power of power usage P2.

As described, when the reflow furnace 600 performs the stopping and the start-up, power energy used is reduced as a whole, when reduced use of power energy A in a period between the time T1 and the time T2 is larger than increased use of power energy B in a period between the time T2 and the time T3. In other words, in this case, power energy used is reduced by performing the stopping and the start-up of the reflow furnace 600.

However, the power usage is increased in the period between the time T2 and the time T3 to start up the reflow furnace 600. Thus, there may be a case where the demand power exceeds the target value and the target value for the demand power used by the other mounting line needs to be decreased.

FIG. 10 is a graph showing power used when the reflow furnaces 600 included in a plurality of mounting lines are stopped and started up.

As shown in (a) in the drawing, three reflow furnaces R1 to R3 are scheduled to be started up at a time between the time T2 and the time T3. Here, the reflow furnaces R1 to R3 are component-mounted board production apparatuses that are included in different mounting lines, respectively. When the mounting line which includes the reflow furnace R1 has a higher first priority level than the other mounting lines, the reflow furnace R1 is preferentially started up at the time between the time T2 and the time T3.

When the reflow furnace R1 is started up at the time between the time T2 and the time T3, there may be a case where the demand power exceeds the target value and thus the reflow furnaces R2 and R3 need to be started up at a time other than the time between the time T2 and the time T3.

In this case, as shown in (b) in the drawing, the power usage changing unit 140 changes the start up time of the reflow furnaces R2 and R3, from the time between the time T2 and the time T3, to the time between the time T1 and the time T2 during which the reflow furnace R1 is not in operation. Thus, the power usage changing unit 140 can reduce power used by the reflow furnaces R2 and R3 in the period between the time T2 and the time T3.

It is to be noted that, although the power used by the reflow furnaces R2 and R3 in the period between the time T1 and the time T2 increases, the reflow furnace R1 is not in operation during the time T1 and the time T2 and the power usage is reduced. Thus, it is possible to level off peak power and start up the reflow furnaces R2 and R3.

In FIG. 7, when judging that the increase in the power used by the power saving equipment in the second period causes the demand power used by the second mounting line in the second period to exceed the target value for the second mounting line in the second period (NO in S212), the power usage changing unit 140 ends the processing.

This ends the processing which the power usage changing unit 140 performs to reduce the power used in the first period by the component-mounted board production apparatuses included in the second mounting line (S112 in FIG. 4).

As it has been described, when the demand power used by the first mounting line in the first period exceeds the target value for the first mounting line in the first period, the mounting-line power control device 100 according to the present invention decreases the target value for the demand power used by the second mounting line and reduces the power used by the component-mounted board production apparatuses which are included in the second mounting line, such that the decreased target value for the second Mounting line in the first period is not exceeded. Thus, power usage is increased or decreased among the mounting lines. In this way, increase in power used by the totality of the mounting lines can be efficiently suppressed.

Furthermore, in the first period, until the demand power used by the second mounting line is equal to or smaller than the decreased target value for the second mounting line, the mounting-line power control device 100 determines the power saving equipment in ascending order of the second priority level, stops the operation of the apparatus included in the determined power saving equipment, and thus reduces the power usage. With this, it is possible to reduce power used by the component-mounted board production apparatuses in ascending order of the priority level.

Furthermore, the mounting-line power control device 100 increases power used by the power saving equipment in the second period, when the increase in the power used by the power saving equipment in the second period does not cause the demand power used by the second mounting line in the second period to exceed the target value for the second mounting line in the second period. With this, the operations of the power saving equipment which are originally scheduled to be performed in the first period can be performed in the second period without exceeding the target value.

Furthermore, the mounting-line power control device 100 (i) decreases, when the first period is not included in the discount period, the target value for the demand power used by the second mounting line in the first period and (ii) does not decrease, when the first period is included in the discount period, the target value for the demand power used by the second mounting line in the first period. In other words, in a period of time other than the discount period, a factory uses a large amount of power, and thus the mounting-line power control device 100 decreases the target value for the demand power used by the second mounting line. Furthermore, in the discount period during which a factory uses less power, the mounting-line power control device 100 does not decrease the target value for the demand power used by the second mounting line. With this, it is possible to switch power usage modes depending on the period of time.

Furthermore, in the first period, when the target value for the demand power used by the first mounting line is decreased, the mounting-line power control device 100 increases the target value for the demand power used by the mounting line different from the first mounting line. Thus, power usage is increased or decreased among the mounting lines. In this way, increase in power used by the totality of the mounting lines can be efficiently suppressed.

While the mounting-line power control device 100 according to an aspect of the present invention has been described so far in the above embodiments, the present invention is not limited to the above description.

That is, the embodiments disclosed herein shall be considered in all aspects as illustrative and not restrictive. The scope of the present invention is indicated by the claims rather than the foregoing description and intended to cover all modifications within the scope of the claims and their equivalents.

For example, in this embodiment, the priority obtaining unit 120 obtains the first priority level and the second priority level, and, based on the first priority level and the second priority level, the power usage changing unit 140 determines the power saving equipment and reduces the power used by the power saving equipment. However, the priority obtaining unit 120 does not necessarily have to obtain the second priority level, and the power usage changing unit 140 may determine the power saving equipment based only on the first priority level and reduce the power used by the power saving equipment.

Furthermore, in this embodiment, the target value changing unit 130 judges whether or not the first period is included in the discount period, and reduces the target value for the demand power used by the second mounting line in the first period based on the result of the judgment. However, the target value changing unit 130 may decrease the target value for the demand power used by the second mounting line in the first period regardless of whether or not the first period is included in the discount period.

Furthermore, in this embodiment, the target value changing unit 130 increases the target value for the demand power used by the third mounting line in the first period, when the target value for the demand power used by the first mounting line in the first period is decreased. However, the target value changing unit 130 does not necessarily have to increase the target value for the demand power used by the third mounting line in the first period, even when the target value for the demand power used by the first mounting line in the first period is decreased.

Furthermore, in this embodiment, the target value changing unit 130 judges for each of the mounting lines whether or not the demand power exceeds the target value. Here, for the correct judgment, it is necessary to know exact amount of power consumed by the apparatuses included in the mounting line and calculate the demand power correctly. Thus, to make a correct judgment, the target value changing unit 130 may perform feedback of measurement errors on power consumption of each apparatus, and correct the demand power.

Furthermore, in this embodiment, the target value changing unit 130 decreases the target value for the demand power used by the second mounting line such that the amount of decrease in the target value for the demand power used by the second mounting line is equal to the amount of increase in the demand power used by the first mounting line. However, the amount of decrease in the target value for the demand power used by the second mounting line is not limited to the above but may be larger or smaller than the amount of increase in the demand power used by the first mounting line.

Furthermore, in this embodiment, the target value changing unit 130 increases the target value for the demand power used by the third mounting line such that the amount increase in the target value for the demand power used by the third mounting line is equal to the amount of the decrease in the demand power used by the first mounting line. However, the amount of increase in the target value for the demand power used by the third mounting line is not limited to the above but may be larger or smaller than the amount of decrease in the demand power used by the first mounting line.

Furthermore, in this embodiment, the power usage changing unit 140 changes the start up time of the reflow furnace 600, and thus reduces the power usage such that the demand power does not exceed the target value. However, the power usage changing unit 140 may change the start up time of a motor, and thus reduce the power usage such that the demand power does not exceed the target value. In this case, by shifting a time of starting and stopping of the motor among the mounting lines, start-up power of the motor and regenerative power of the motor can be offset, and the power usage can be reduced.

It is to be noted that the present invention can be implemented not only as the above-described mounting-line power control device 100, but also as a mounting-line power control method having, as steps, characteristic processing performed by processing unit included in the mounting-line power control device 100. Furthermore, the present invention can be implemented as a program and an integrated circuit which cause a computer to execute such characteristic processing included in the mounting-line power control method. In addition, it goes without saying that such a program may be distributed via a recording medium such as a CD-ROM and a communication network such as the Internet.

Furthermore, the present invention may be used to increase or decrease the target value for the demand power used by the totality of the mounting lines in response to a change in power energy used by other equipment, which is different from the mounting lines and uses large power energy in a factory.

Industrial Applicability

The present invention can be applied to a mounting-line power control device which controls the power used by mounting lines, and particularly to a mounting-line power control device or the like which is capable of controlling an increase in power used by the totality of the mounting lines.

REFERENCE SIGNS LIST

- 10 Mounting line group
- 11, 12 Mounting line
- 20 Board
- 20*a* Component-mounted board
- 100 Mounting-line power control device
- 110 Target value obtaining unit
- 120 Priority obtaining unit
- 130 Target value changing unit
- 140 Power usage changing unit
- 200 Component mounting apparatus (component-mounted board production apparatus)
- 300 Printing apparatus (component-mounted board production apparatus)
- 400 Inspection apparatus (component-mounted board production apparatus)
- 500 Adhesive applicator (component-mounted board production apparatus)
- 600 Reflow furnace (component-mounted board production apparatus)

The invention claimed is:

1. A mounting-line power control device which controls power used by a mounting line group including a plurality of mounting lines each of which includes a component-mounted board production apparatus for producing a component-mounted board on which a component is mounted, said mounting-line power control device comprising:

a target value obtaining unit configured to obtain, for each of the mounting lines, a target value for demand power which indicates power energy used in a first period;

a priority obtaining unit configured to obtain a first priority level that is a priority level of each of the mounting lines for use of power;

a target value changing unit configured to decrease the target value for the demand power used by a second mounting line in the first period when the demand power used by a first mounting line in the first period exceeds the target value for the first mounting line in the first period, the first mounting line being included in the mounting line group, and the second mounting line being included in the mounting line group and having the first priority level lower than the first priority level of the first mounting line; and a power usage changing unit configured to reduce power used in the first period by the component-mounted board production apparatus which is included in the second mounting line, such that the demand power used by the second mounting line in the first period does not exceed the decreased target value for the second mounting line in the first period.

2. A mounting-line power control device according to claim 1, wherein the second mounting line includes a plurality of component-mounted board production apparatuses including the component-mounted board production apparatus, said priority obtaining unit is further configured to obtain a second priority level that is a priority level of each of the component-mounted board production apparatuses for use of power, and said power usage changing unit is configured to (i) determine power saving equipment in ascending order of the second priority level, and (ii) reduce power used by the determined power saving equipment in the first period until the demand power used by the second mounting line in the first period is equal to or smaller than the decreased target value for the second mounting line in the first period, the power saving equipment being the component-mounted board production apparatus of which power usage in the first period is reduced among the component-mounted board production apparatuses included in the second mounting line.

3. A mounting-line power control device according to claim 2, wherein the power saving equipment includes a plurality of apparatuses, and said power usage changing unit is configured to reduce power used in the first period by stopping, during the first period, operation of a power saving apparatus that is one of the apparatuses included in the power saving equipment.

4. The mounting-line power control device according to claim 2, wherein said target value obtaining unit is further configured to obtain the target value for the demand power used by the second mounting line in a second period that is different from the first period, and said power usage changing unit is further configured to increase power used by the power saving equipment in the second period, when the increase in the power used by the power saving equipment in the second period does not cause the demand power used by the second mounting line in the second period to exceed the target value for the second mounting line in the second period.

5. A mounting-line power control device according to claim 4,
wherein the power saving equipment is a first reflow furnace which fixes a component onto a board by heating the board on which the component is mounted, and
said power usage changing unit is configured to reduce power used by the first reflow furnace in the first period and increase power that can be used by the first reflow furnace in the second period, by changing a start-up time of the first reflow furnace from a time included in the first period to a time included in the second period, the second period being included in a period during which a second reflow furnace, which is included in one of the mounting lines different from another one of the mounting lines which includes the first reflow furnace, is not in operation.

6. A mounting-line power control device according to claim 1,
wherein said target value changing unit is configured:
to judge whether or not the first period is included in a discount period during which a unit price of electricity charges is discounted, and
to decrease, when judging that the first period is not included in the discount period, the target value for the demand power used by the second mounting line in the first period, and
not to decrease, when judging that the first period is included in the discount period, the target value for the demand power used by the second mounting line in the first period.

7. A mounting-line power control device according to claim 1,
wherein, when the target value for the demand power used by the first mounting line in the first period is decreased, said target value changing unit is further configured to increase the target value for the demand power used in the first period by a third mounting line that is included in the mounting line group and different from the first mounting line.

8. A mounting-line power control method of controlling power used by a mounting line group including a plurality of mounting lines each of which includes a component-mounted board production apparatus for producing a component-mounted board on which a component is mounted, said mounting-line power control method comprising:
obtaining, for each of the mounting lines, a target value for demand power which indicates power energy used in a first period;
obtaining a first priority level that is a priority level of each of the mounting lines for use of power;
decreasing the target value for the demand power used by a second mounting line in the first period when the demand power used by a first mounting line in the first period exceeds the target value for the first mounting line in the first period, the first mounting line being included in the mounting line group, and the second mounting line being included in the mounting line group and having the first priority level lower than the first priority level of the first mounting line; and
reducing power used in the first period by the component-mounted board production apparatus which is included in the second mounting line, such that the demand power used by the second mounting line in the first period does not exceed the decreased target value for the second mounting line in the first period.

9. A non-transitory computer-readable recording medium having a program recorded thereon for controlling power used by a mounting line group including a plurality of mounting lines each of which includes a component-mounted board production apparatus for producing a component-mounted board on which a component is mounted, the program causing a computer to execute:
obtaining, for each of the mounting lines, a target value for demand power which indicates power energy used in a first period;
obtaining a first priority level that is a priority level of each of the mounting lines for use of power;
decreasing the target value for the demand power used by a second mounting line in the first period when the demand power used by a first mounting line in the first period exceeds the target value for the first mounting line in the first period, the first mounting line being included in the mounting line group, and the second mounting line being included in the mounting line group and having the first priority level lower than the first priority level of the first mounting line; and
reducing power used in the first period by the component-mounted board production apparatus which is included in the second mounting line, such that the demand power used by the second mounting line in the first period does not exceed the decreased target value for the second mounting line in the first period.

* * * * *